United States Patent
Aikawa et al.

[11] Patent Number: 5,889,725
[45] Date of Patent: Mar. 30, 1999

[54] DECODER CIRCUIT FOR A SEMICONDUCTOR MEMORY DEVICE

[75] Inventors: Tadao Aikawa; Hirohiko Mochizuki; Atsushi Hatakeyama; Shusaku Yamaguchi; Koichi Nishimura, all of Kawasaki, Japan

[73] Assignee: Fujitsu Limited, Kanagawa, Japan

[21] Appl. No.: 915,332

[22] Filed: Aug. 20, 1997

[30] Foreign Application Priority Data

Dec. 17, 1996  [JP]  Japan .................................. 8-337337

[51] Int. Cl.$^6$ ...................................................... G11C 8/00
[52] U.S. Cl. .................. 365/230.06; 365/230.08; 365/105
[58] Field of Search ............... 365/230.06, 230.08; 326/105

[56] References Cited

U.S. PATENT DOCUMENTS

| | | | |
|---|---|---|---|
| 5,379,264 | 1/1995 | Kobayashi et al. | 365/230.06 |
| 5,402,377 | 3/1995 | Ohhata et al. | 365/200 |
| 5,467,318 | 11/1995 | Motomura | 365/230.06 |
| 5,668,772 | 9/1997 | Hotta | 365/230.06 |
| 5,721,709 | 2/1998 | Nakamura | 365/230.06 |

*Primary Examiner*—David Nelms
*Assistant Examiner*—Vanthu Nguyen
*Attorney, Agent, or Firm*—Nikaido, Marmelstein, Murray & Oram, LLP

[57] ABSTRACT

A semiconductor or memory device has a decoder circuit for decoding a plurality of external address signals. The external address signals include first and second external address signals. A first address buffer receives the first external address signals and outputs first internal address signals to first address lines. A second address buffer receives the second external address signals and outputs second internal address signals to second address lines. First predecoders have input terminals connected to the first address lines, and output first predecode signals to first predecode lines. Second predecoders have input terminals connected to the second address lines and output second predecode signals to second predecode lines. Main decoders have input terminals connected to the first predecode lines and the second predecode lines and output decode signals. The number of the first external address signals are greater than the number of the second external address signals. The second predecoders and the second predecode lines are provided at least in double in such a manner that inputs of the main decoders to be connected to each of the second predecode lines are equal in number to inputs of the main decoders to be connected to each of the first predecode lines. It is possible to shorten the transition time of predecode signals because of the same capacitive load of the predecoder circuit.

13 Claims, 10 Drawing Sheets

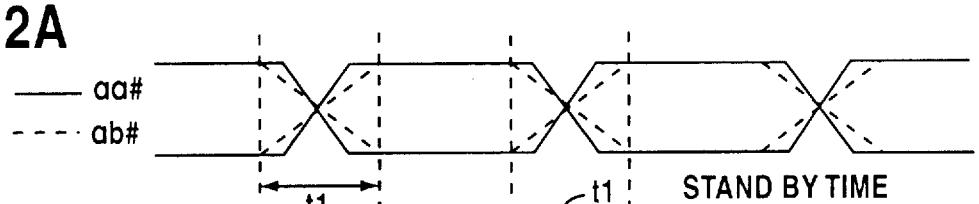
FIG.2A
— aa#
- - - ab#
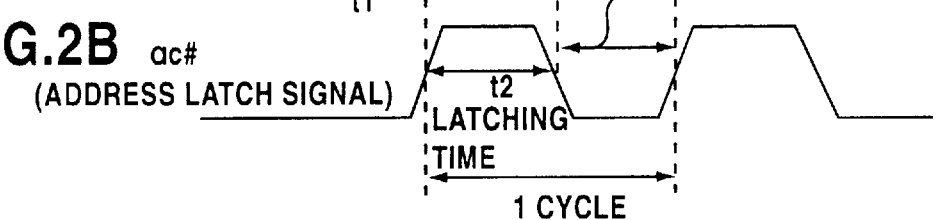
FIG.2B ac#
(ADDRESS LATCH SIGNAL)

ADDRESS BUFFER CIRCUIT

PREDECODER CIRCUIT

PREDECODER CIRCUIT

MAIN DECODER CIRCUIT

DECODER CIRCUIT FOR A SEMICONDUCTOR MEMORY DEVICE

BACKGROUND OF THE INVENTION

1. Field of the Invention

The present invention relates to a decoder circuit of a semiconductor memory device, and, more particularly, to the structures of address lines and predecode lines which can shorten the cycle time.

2. Description of the Related Art

The capacities of semiconductor memory devices like dynamic random access memories and static memories are becoming ever greater. To match the increment, the number of addresses for designating a memory address is increasing too. A conventional decoder circuit is separated into predecoders and main decoders in accordance with the increased number of addresses to reduce the burden on an address buffer or the like. The predecoders are further separated into a plurality of predecoder groups to which divided addresses are respectively input. Predecoded signals are then input to the main decoders.

The number of addresses is determined by the memory capacity and the structure of the output circuit. In dividing an address to a plurality of sub addresses, it is inevitable that the number of divided addresses does not become uniform. As a result, the capacitive loads of the address lines or the outputs of address buffers and the predecode lines or the outputs of predecoders vary from one divided group to another.

In general, a decoder circuit outputs its decoded output in response to an address latch signal or the like after an address signal to be input is settled. The time for one cycle therefore comprises a standby time (address transition time) from the input of the address signal to the settlement of the input of the decoder circuit and an address latching time for the output of the decoder circuit to become valid after settlement.

When predecoders are unevenly divided as mentioned above, the timing for settling the predecode lines or the inputs of the main decoders vary. This variation leads first to variations in the start times for the rising and falling of the predecode lines, secondly to a variation in the rising duration or the falling duration, and further to variations in the end times for the rising and falling of the predecode lines. Such variations demand a longer standby time (address transition time) for the input signals to the main decoders to be settled. This results in a longer cycle time, or a shorter address latching period if the cycle time is constant.

SUMMARY OF THE INVENTION

Accordingly, it is an object of the present invention to provide a semiconductor memory device having a decoder circuit which ensures substantially uniform loads on a plurality of divided address lines and predecode lines.

It is another object of this invention to provide a semiconductor memory device having a decoder circuit which ensures uniform loads on a plurality of divided address lines and predecode lines and a high efficiency of laying those lines.

To achieve those objects, according to one aspect of this invention, a semiconductor memory device having a decoder circuit for decoding a plurality of address signals, said address signals including first address signals on first address lines and second internal address signals on second address lines;

first predecoders having input terminals connected to the first address lines, for outputting first predecode signals to first predecode lines;

second predecoders having input terminals connected to the second address lines, for outputting second predecode signals to second predecode lines; and main decoders having input terminals connected to the first predecode lines and the second predecode lines, for outputting decode signals, the number of the first address signals being greater than the number of the second address signals, and the second predecoders and the second predecode lines being provided at least in double in such a manner that inputs of the main decoders to be connected to the second predecode lines are equal in number to inputs of the main decoders to be connected to the first predecode lines.

It is preferable that the main decoders in this semiconductor memory device include first main decoders and second main decoders, a half of the doubled second predecode lines are arranged on a side of the first main decoders to be connected to the input terminals thereof, and the other half of second predecode lines are arranged on a side of the second main decoders to be connected to the input terminals thereof.

According to this invention, it is possible to make the number of the inputs of the main decoders to be connected to the first predecode lines equal to the number of the inputs of the main decoders to be connected to the second predecode lines, and to shorten the transition time of predecode signals that are output onto the predecode lines at the time of the transition of the external address signals.

It is noted that the external and internal address signals in the present invention does not necessarily mean the address signals outside or inside the semiconductor device.

To achieve the aforementioned objects, according to another aspect of this invention, a semiconductor memory device having a decoder circuit for decoding a plurality of external address signals supplied, said external address signals including first and second external address signals, comprises:

a first address buffer for receiving the first external address signals and outputting first internal address signals to first address lines;

a second address buffer for receiving the second external address signals and outputting second internal address signals to second address lines;

first predecoders having input terminals connected to the first address lines, for outputting first predecode signals to first predecode lines;

second predecoders having input terminals connected to the second address lines, for outputting second predecode signals to second predecode lines; and main decoders having input terminals connected to the first predecode lines and the second predecode lines, for outputting decode signals, the number of the first external address signals being greater than the number of the second external address signals, and the second predecode lines being provided at least in double in such a manner that inputs of the main decoders to be connected to the second predecode lines are equal in number to inputs of the main decoders to be connected to the first predecode lines, a plurality of outputs of the second predecoders respectively driving the doubled second predecode lines.

According to this invention, the second predecoders have output terminals in double, the second predecode lines are provided in double and are driven by the outputs from the respective output terminals, so that the second predecode lines can be made equal in number to the input terminals of the main decoders to which the second predecode lines are to be connected.

BRIEF DESCRIPTION OF THE DRAWINGS

FIGS. 2A and 2B are a timing chart briefly illustrating a variation in address transition time (standby time);

DETAILED DESCRIPTION OF THE PREFERRED EMBODIMENT

A preferred embodiment of the present invention will now be described with reference to the accompanying drawings. It is to be noted that the technical scope of this invention is in no way restricted by this embodiment.

Figure 1:
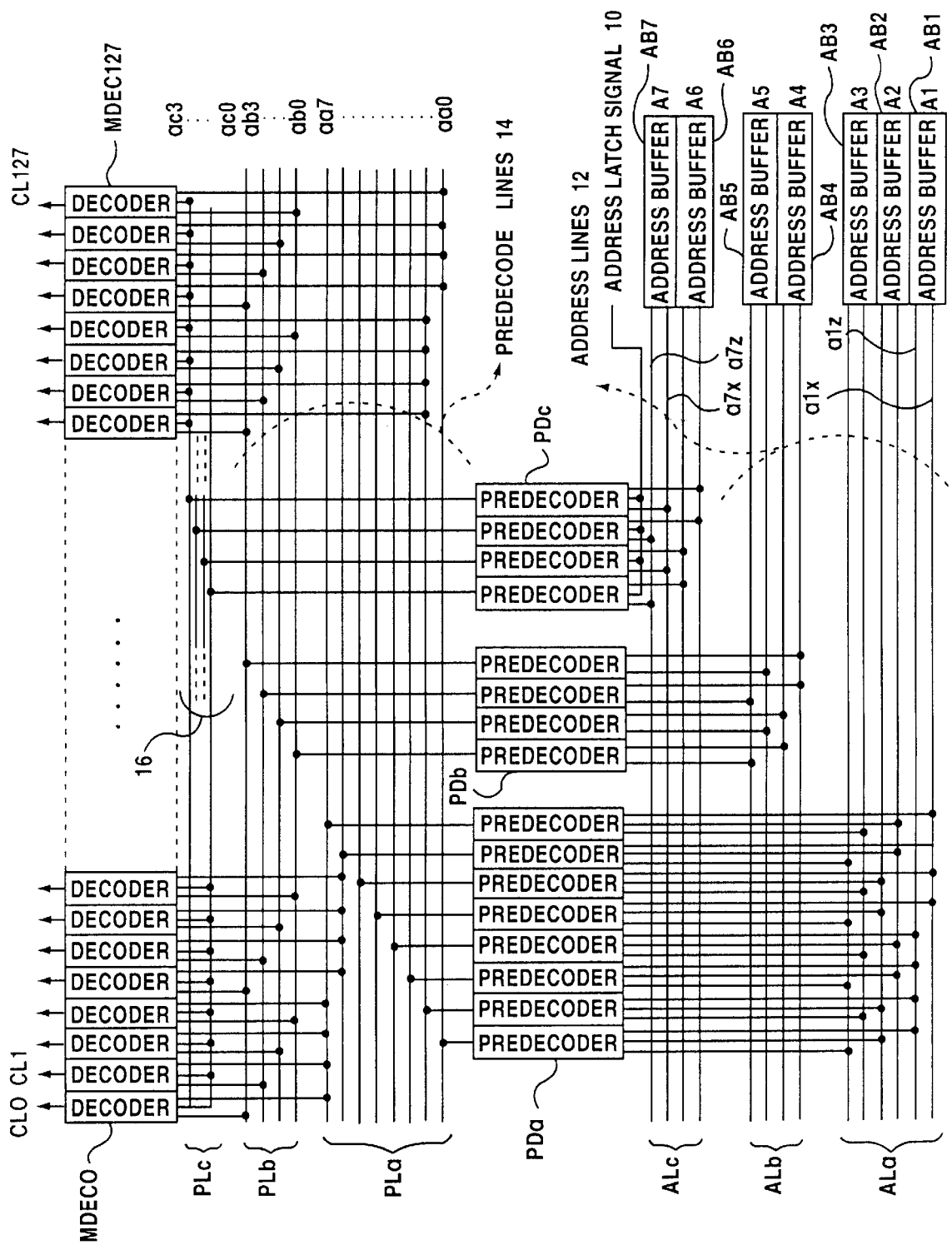
FIG. 1 is a circuit diagram of a general decoder circuit.

FIG. 1 is a circuit diagram of a general decoder circuit. In this example, seven external address signals A1 to A7 are separated to three groups, a group a consisting of the signals A1–A3, a group b consisting of the signals A4 and A5, and a group c consisting of the signals A6 and A7.

The individual address signals A1–A7 are converted by respective address buffers AB1 to AB7 to inverted and non-inverted internal address signals a1x and a1z~a7x and a7z which are then supplied onto address lines 12. The address lines 12 are separated to address line groups ALa, ALb and ALc in association with the groups a, b and c, so that the internal address signals are input to respective predecoder groups of predecoders PDa, PDb and PDc to be predecoded. The outputs of the predecoders PDa, PDb and PDc drive predecode lines 14. That is, the outputs of the predecoders PDa, PDb and PDc respectively drive groups of predecode lines PLa, PLb and PLc.

In the figure, the predecode line group PLa consists of eight predecode signals aa0 to aa7, the predecode line group PLb consists of four predecode signals ab0 to ab3, and the predecode line group PLc consists of four predecode signals ac0 to ac3. An address latch signal 10 is also input to the predecoders PDc so that the outputs of the predecoders PDc are enabled by the effective level of the address latch signal 10.

Finally, each one predecode signals aa, ab and ac, from the associated predecode line group PLa, PLb or PLc, are supplied as input signals to main decoders MDEC0 to MDEC127 which respectively output final decode signals CL0 to CL123. In this example, the final decode signals CL0–CL127 are used as signals to select the outputs of sense amplifiers on the column side of a memory cell array, for example. Of course the final decode signals may be used to drive word lines.

In this typical decoder circuit, eight predecoders PDa are provided for the three address signals A1, A2 and A3, and four predecoders PDb or PDc are provided for the two address signals A4 and A5, or A6 and A7, respectively. In other words, this is logically the simplest structure.

With this structure, each address line 12 in the address line group ALa is connected to the input terminals of the four predecorders PDa. Each address lines 12 in the address line group ALb is connected to the input terminals of only two predecorders PDb. As a result, the load on the address lines in the address line group ALa differs from the load on the address lines in the address line group ALb, causing a variation in the transition time of address signals on the address lines 12. With the predecoders PDc, the settling time is controlled by the address latch signal 10, so that a variation in load for those predecoders has not been set aside for the sake of explanation.

The main decoders MDEC0–MDEC127 are separated into four groups by the predecode signals ac0–ac3. Each group consists of 32 main decoders. Therefore, of the predecode lines 14 which are driven by the predecoders, those in the predecode line group PLa are connected to the input terminals of 4×4=16 main decoders MDEC, and those in the predecode line group PLb are connected to the input terminals of 8×4=32 main decoders MDEC. Apparently, the load on the predecode line group PLb becomes greater than that on the predecode line group PLa. This variation in load on the predecode lines in the predecode line groups causes a variation in the transition time of the predecode signals on the predecode lines 14.

The drive performance of the address buffers, the loads on the address lines 12, the input loads of the predecoders and so forth determine the transition time of the address signals on the address lines 12. Likewise, the transition time of the predecode signals on the predecode lines 14 is determined by the drive performance of the predecoders, the loads on the predecode lines 14 the input loads of the main decoders MDEC0~127 and so forth. Variations in load on the address lines 12 and the predecode lines 14 cause the overall transition time of the address signals to significantly vary.

FIG. 2A and FIG. 2B is a timing chart briefly illustrating a variation in address transition time (standby time). In this figure, FIG. 2A denotes predecode signals aa# and ab#, and FIG. 2B indicates a predecode signal ac# whose timing is controlled by the address latch signal 10. Since, as mentioned above, the address line group ALa has a heavier load than the address line group ALb and the predecode line group PLa has a lighter load than the predecode line group PLb in this example, the rising and falling times of the predecode signal aa# are shorter than those of the predecode signal ab# and the transition time of the predecode signal aa# is shorter than that of the predecode signal ab#. Thus, the standby time t1 or the overall transition time becomes relatively long. Because one cycle time consists of the standby time t1 for the settlement of the predecode signal as an input to the main decoder and an address latching time t2 after the settlement as mentioned earlier, the cycle time becomes longer. With the cycle time being constant, the address latching time t2 becomes shorter, resulting in a shorter effective period of the output CL of the main decoder.

Figure 3:
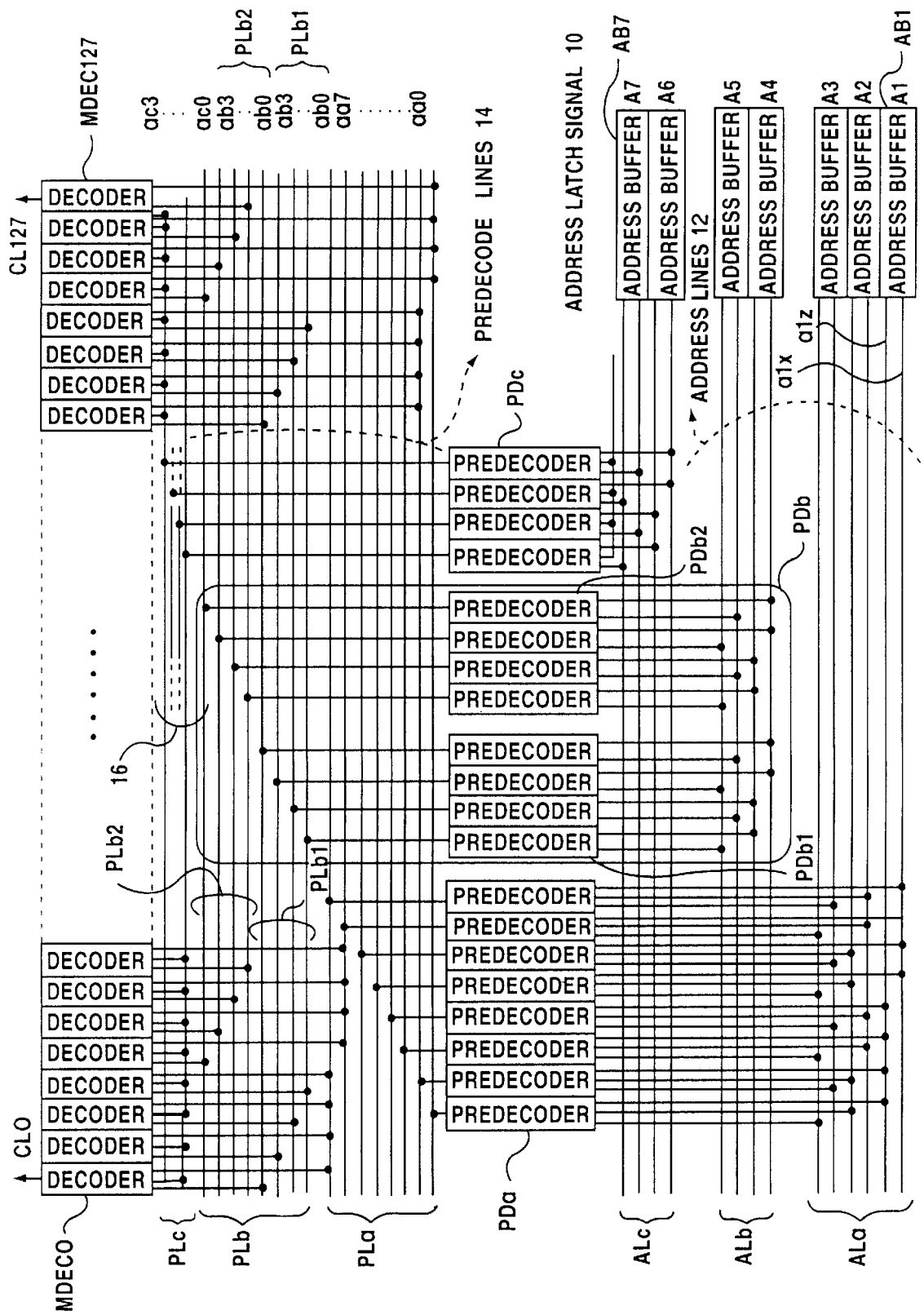
FIG. 3 is a diagram exemplifying a decoder circuit according to this invention.
Figure 4A:
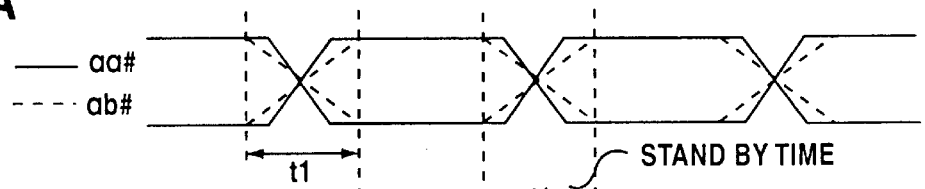
FIG. 4A–4D are a timing chart for the decoder circuit shown in FIG. 3.
Figure 4B:
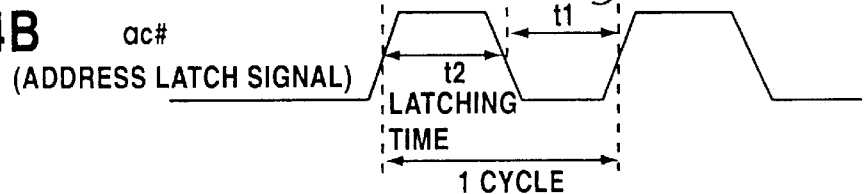
Figure 4C:
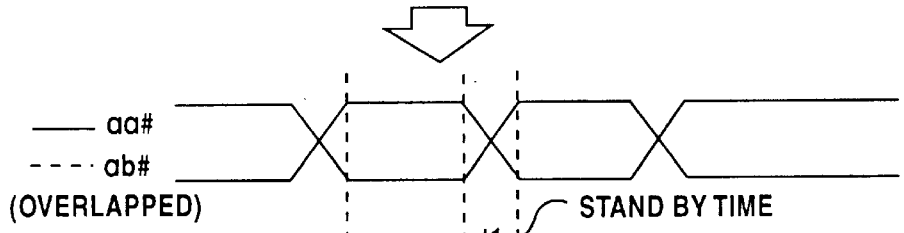
Figure 4D:
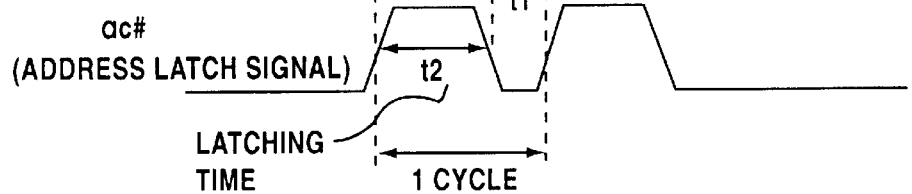

FIG. 3 is a diagram exemplifying a decoder circuit according to this invention. This decoder circuit differs from that in FIG. 1 in that the number of the predecoders PDb is double the number of those in FIG. 1. Predecoders PDb1 and PDb2 respectively receive the address signals from the address buffers AB4 and AB5 and respectively drive predecode line groups PLb1 and PLb2. That is, the predecoders PDb1 and PDb2 and the predecode line groups PLb1 and PLb2 which are driven by the outputs of the predecoders PDb1 and PDb2 are provided in double. As a result, the number of the lines in the predecode line group PLb is doubled to be eight, two sets (PLb1 and PLb2) for the four predecode signals ab0 to ab3, while the number of the main decoders to be connected to the lines ab0–ab3 in the predecode line group PLb1 and PLb2 is halved to be 4×4=16. Accordingly, the load on the predecode line group PLb becomes half the load in FIG. 1, as does the number of the main decoders connected to the predecode line group PLa. Given that the lines PLa and PLb have the same width and length, the loads of both lines PLa and PLb become equal to each other.

The input terminals of each four predecoders are connected to the address line group ALb, so that the number of input terminals is doubled as compared with those in FIG. 1. As the input terminals of four predecoders PDa are also connected to each address line 12 of the address line group ALa, however, the number of input terminals connected to the address line group ALa is the same as the number of input terminals connected to the address line group ALb.

The decoder circuit illustrated in FIG. 3, as discussed above, is designed in such a way that the number of the input terminals of predecoders to be connected to the address lines 12 are the same, and that the number of the input terminals of the main decoders to be connected to the predecode lines 14 are the same. As a result, the loads that are connected to the lines extending from the address buffers AB1–AB5 to the main decoder MDEC substantially become uniform.

From a different viewpoint, in the decoder circuit in FIG. 3, the number of the predecoders PDb is equal to the number of the predecoders PDa. Accordingly, the number of lines in the predecode line group PLb becomes equal to that of the lines in the predecode line group PLa. It is therefore possible to make the number of the inputs of the main decoders to be connected to the predecode line group PLb equal to the number of the inputs of the main decoders to be connected to the predecode line group PLa.

FIG. 4 is a timing chart for the decoder circuit shown in FIG. 3. In the figure, FIG. 4A and FIG. 4B present a timing chart for the decoder circuit in FIG. 1, which is identical to the timing chart in FIG. 2A and FIG. 2B. In the figure, FIG. 4C and FIG. 4D present the timing chart for the decoder circuit in FIG. 3. As apparent from the comparison of both timing charts with each other, the decoder circuit in FIG. 3 has such a characteristic that predecode signals aa# and ab# approximately overlap each other, and the standby time t1 for the predecode signal to be settled becomes shorter than the one in the case FIG. 4A. If the address latching time t2 is set equal to the one in the case FIG. 4B, the total cycle time becomes shorter.

In the example of FIG. 3, the number of the input terminals of the main decoders MDEC to be connected to the predecode line group PLb is reduced to a half, while the number of the predecoders to be connected to the address line group ALb is doubled. To shorten the standby time at the time of transition of the address signals shown in FIG. 4, however, it is essential that all the predecode lines 14 behave in the same manner and the timings for changes in their signals and the transition periods are uniform. In the case where the transitional timing for some lines which alone are fast differs from that for the other lines, therefore, the transition time t1 in FIG. 4 cannot be shortened. In this respect, the loads of the address lines 12 and the predecode lines 14 in the decoder circuit in FIG. 3 are nearly uniform, so that the waveforms of the predecode lines substantially overlap one another, if one can neglect variations or the like of the drive performances of their drive circuits that occurs due to a manufacturing process variation. It is thus possible to shorten the standby time (transition time) t1.

Figure 5:
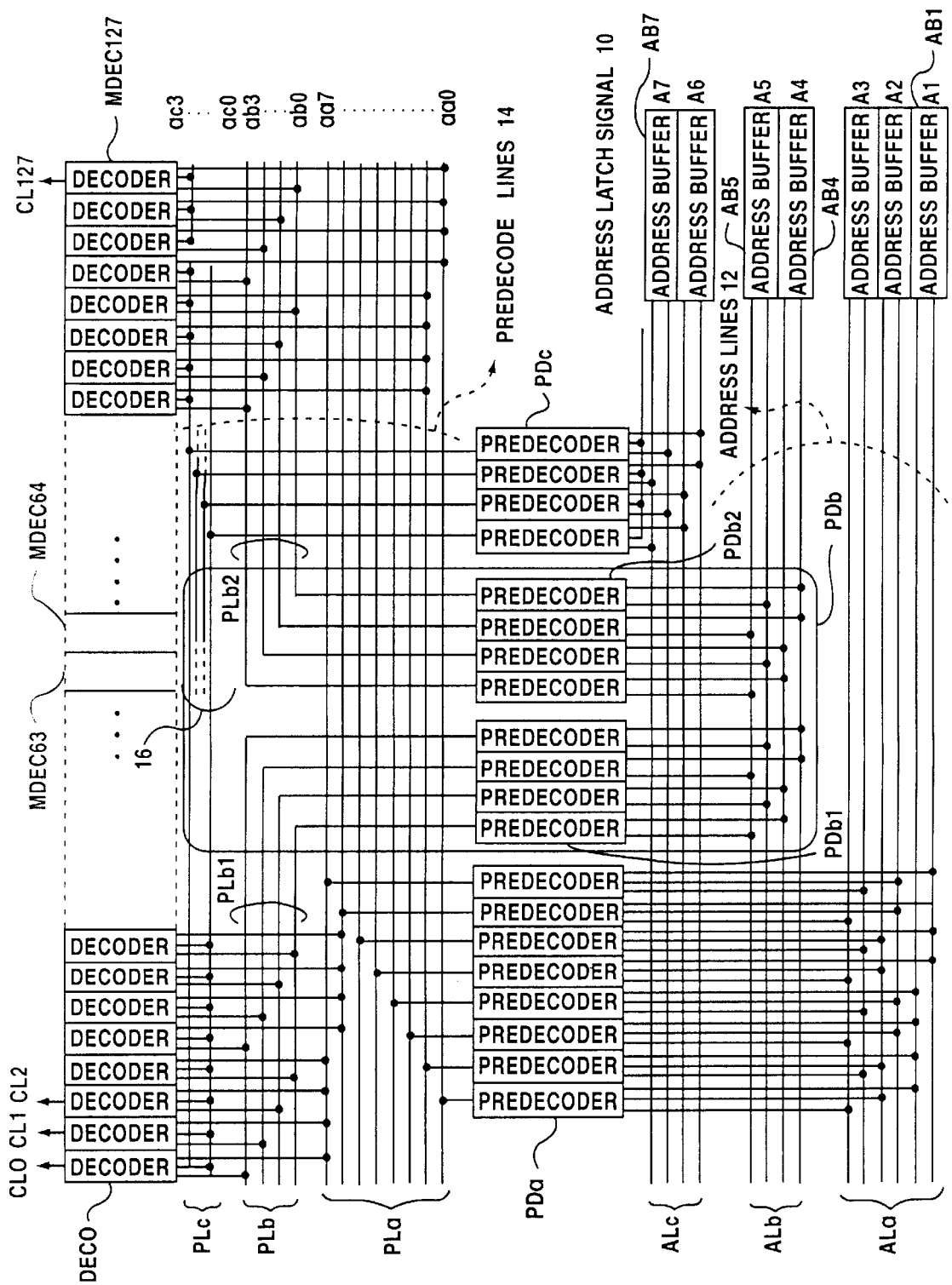
FIG. 5 is a diagram showing a decoder circuit which is a modification of the one in FIG. 3.

FIG. 5 is a diagram showing a decoder circuit which is an improved version of the decoder circuit in FIG. 3. In this example, as in the case of FIG. 3, the predecoders PDb are provided in double as PDb1 and PDb2 and the loads of the predecode line groups PLb1 and PLb2 which are driven by the predecoders PDb1 and PDb2 are made substantially uniform. the number of the input terminals of the main decoders to be connected to each of the predecode line groups PLb1 and PLb2 is 4×4=16. The circuit in FIG. 5 differs in the one in FIG. 3 in that the predecode line groups PLb1 and PLb2 are branched to left and right, the predecode lines PLb1 connected to the input terminals of the main decoders MDEC0 to MDEC63 while the predecode lines PLb2 are connected to the input terminals of the main decoders MDEC64 to MDEC127.

This structure can halve the parasitic load capacitances of the predecode line groups PLb1 and PLb2 as well as can reduce the occupation area for the predecode line group PLb to a half. As the predecode lines PLa are used to supply input signals to all the main decoders MDEC0–MDEC127, the lines cannot be branched to right and left. Even if the line capacitance of the predecode lines PLb are reduced to a half, therefore, the standby time t2 may be restricted by the speed of the predecode lines PLa. In FIG. 5, therefore, there is a greater technical significance on the reduction of the occupation area for the lines PLb to a half than the reduction of their line capacitance.

Accordingly, it is sufficient that only four predecode lines PLb in the vertical direction on the drawing sheet in FIG. 5 are added, and only in this respect, the predecode lines PLb can be laid with about the same line area as done in FIG. 1. Since the predecode signals in FIG. 5 are identical to those in FIG. 4C, their description will not be repeated below.

Figure 6:
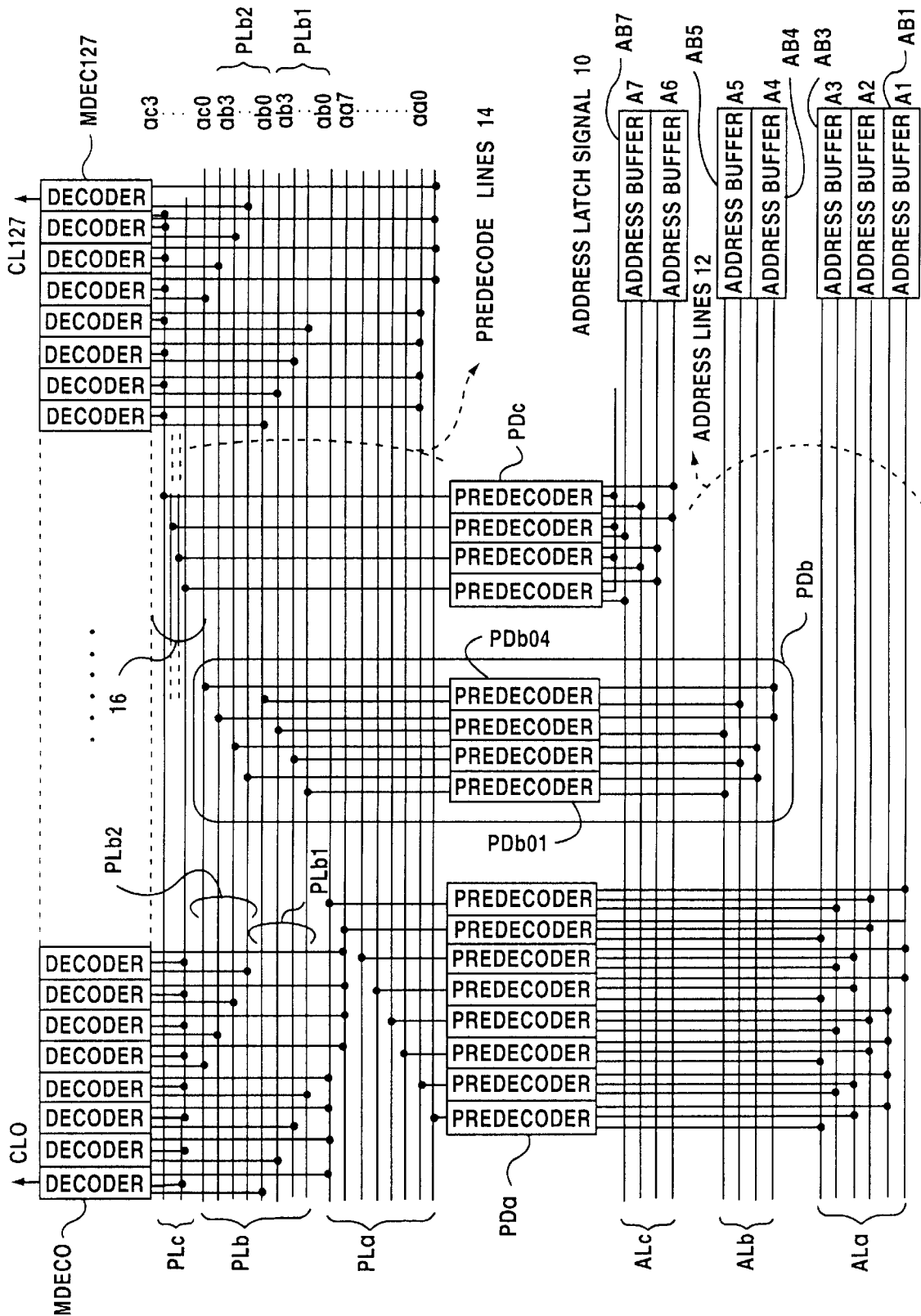
FIG. 6 is a diagram exemplifying another decoder circuit to which this invention is adapted.
Figure 7A:
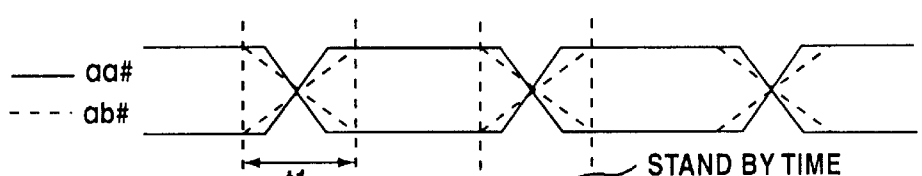
FIG. 7A–7D are a schematic timing chart for the decoder circuit shown in FIG. 6.
Figure 7B:
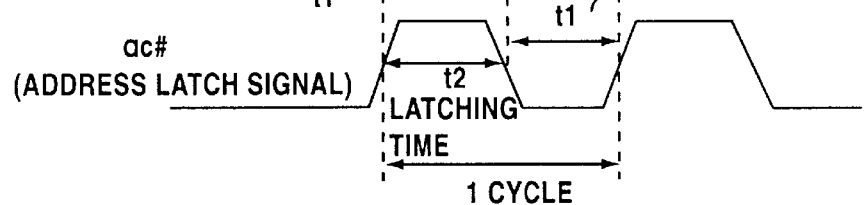
Figure 7C:
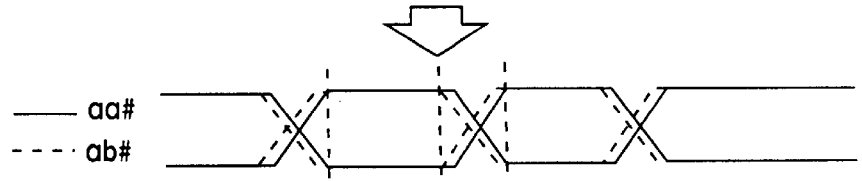
Figure 7D:
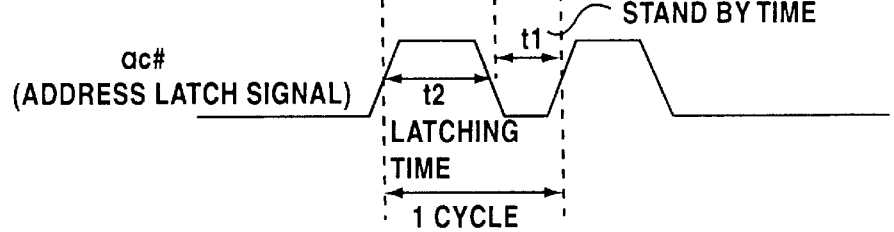

FIG. 6 is a diagram exemplifying another decoder circuit to which this invention is adapted. While there is only one set of predecoders PDb in this example, each of the predecoders PDb01–PDb04 drives two predecode lines 14 through its two output terminals. That is, each address line of the address line group ALb is simply connected to the input terminals of two predecoders PDb, and it still has a lighter load than the address line group ALa. With regard to the predecode lines PLb, however, the number of the input terminals of the main decoders to those lines PLb is 4×4=16, which is a half the number in FIG. 1.

In this example, an inverter, a buffer or the like is added to the output stage of each of the predecoders PDB01–PDB04 so that its drive transistors drive two predecode lines 14. This design can prevent the drive performance of the predecoders PDb from being reduced to a half. Those predecoders will be discussed later.

FIG. 7 is a schematic timing chart for the decoder circuit shown in FIG. 6. In this figure too, FIG. 7A and FIG. 7B present the same timing chart as the timing chart in FIG. 2. In the figure, FIG. 7C and FIG. 7D present a timing chart for the decoder circuit in FIG. 6. As mentioned above, there are two input terminals of each predecoder PDb01~PDb04 to be connected to the address line group ALb, which is less than what is connected to the address line group ALa. The start of the transition for the predecode lines PLb, i.e. predecode signals ab#, which are the outputs of the predecoders PDb become slightly faster than that for the predecode lines PLa, i.e. predecode signlas aa#, accordingly. Since the predecode lines PLa and PLb have equal loads, however, the transition periods are equal to each other. As indicated by in FIG. 7C, therefore, the transition of the predecode signal ab# is faster than that of the predecode signal aa#. Both transition periods (periods for rising or falling) are however about equal to each other. Consequently, the predecode signals aa# and ab# substantially overlap each other, so that the standby time t1 can be made shorter than the one in FIG. 1.

Figure 8:
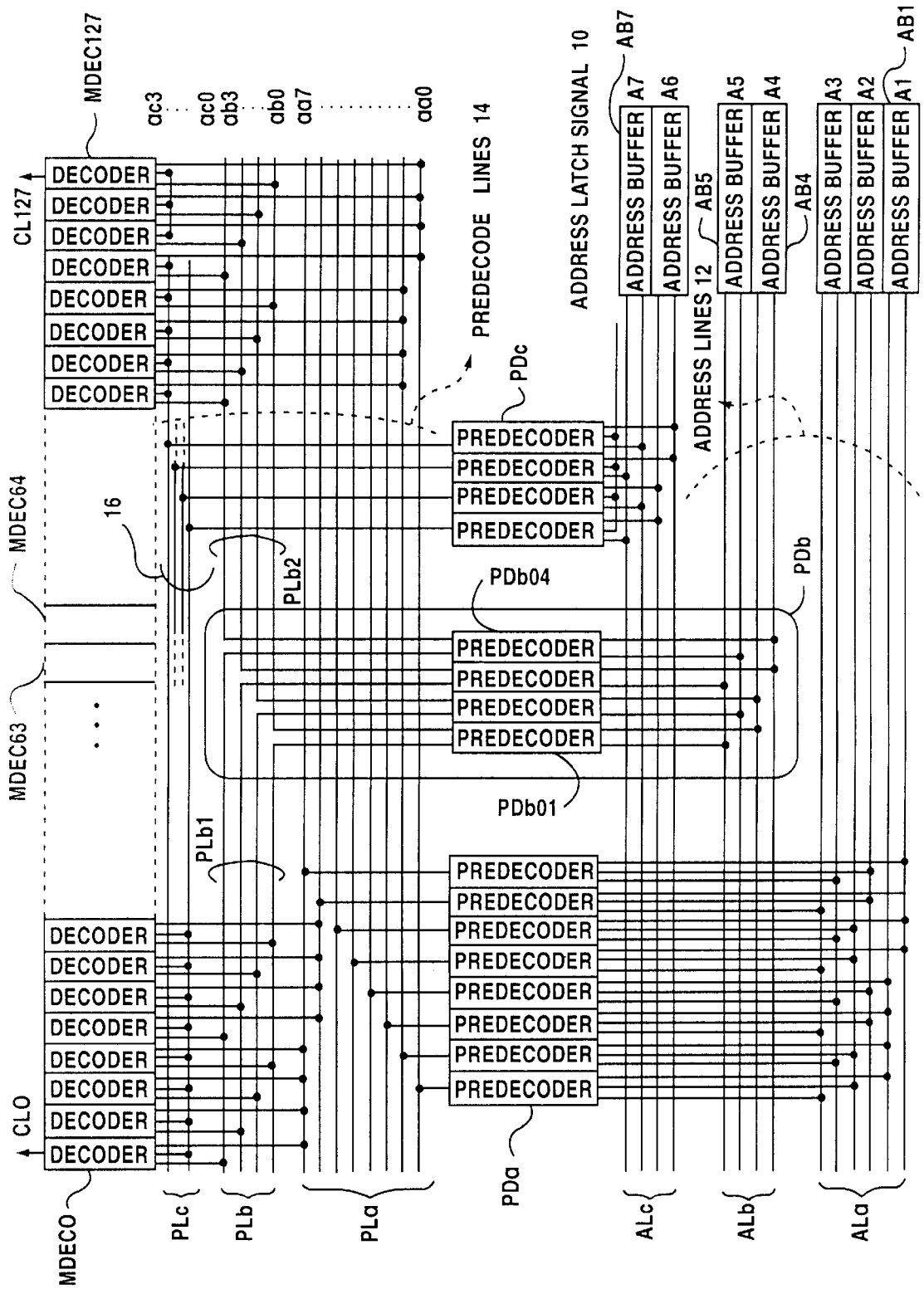
FIG. 8 is a diagram exemplifying a further decoder circuit to which this invention is adapted.

FIG. 8, like FIG. 5, shows an example where the predecode line groups PLb1 and PLb2 of the decoder circuit PDb shown in FIG. 6 are branched to left and right. That is, although the load of the address line group ALb is smaller than that of the address line group ALa, there are two outputs of each predecoder PDb to respectively drive the associated predecode lines PLb1 and PLb2. As a result, the predecode line groups PLb1 and PLb2 have equal loads. What is more, those predecode lines PLb1 and PLb2 are branched to right and left to become the inputs of the main decoders MDEC0–MDEC63 and the inputs of the main decoders MDEC64–MDEC127. It is therefore possible to reduce the occupation area of the predecode lines PLb to a half as in the modification in FIG. 5 of the decoder circuit in FIG. 3.

As the timing chart for the decoder circuit in FIG. 8 is identical to the one illustrated in FIG. 7, its description will be omitted.

Address Buffers

Figure 9:
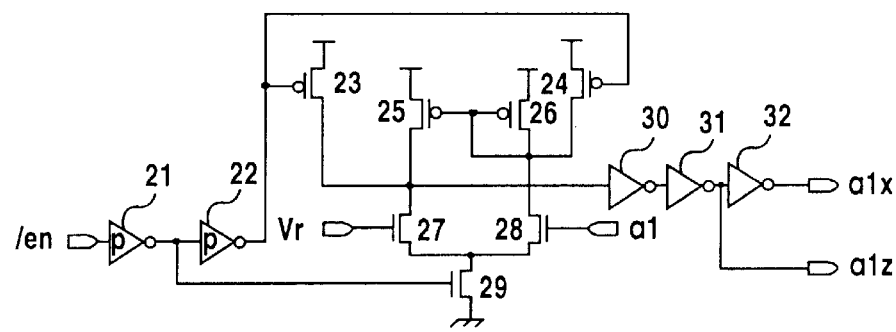
FIG. 9 is a diagram exemplifying an address buffer.

FIG. 9 is a diagram exemplifying the address buffer. Address buffers AB1 to AB7 are all identical to one another, and FIG. 9 shows the address buffer AB1 as an example. In this address buffer, a comparator for comparing an address signal a1 with a reference voltage Vr is designed to be enabled by an enable signal /en. Specifically, the comparator comprises P channel transistors 25 and 26 and N channel transistors 27 and 28 with their sources connected together. Further provided are an N channel transistor 29 and P channel transistors 23 and 24 which are controlled by the enable signal /en.

Reference numerals "30," "31" and "32" denote inverters of a CMOS type, for example. When the enable signal /en has an L level, the transistors 29, 23 and 24 are turned on, enabling the comparator. In accordance with the H and L levels of the address signal a1, inverted and uninverted, wave-shaped address signals a1x and a1z are output. When the enable signal /en becomes an H level, the transistors 29, 23 and 24 are turned off to disable the comparator so that the current will not be consumed. The letters "z" and "x" of the individual signals respectively mean the H active state and the L active state.

Predecoders

Figure 10A:
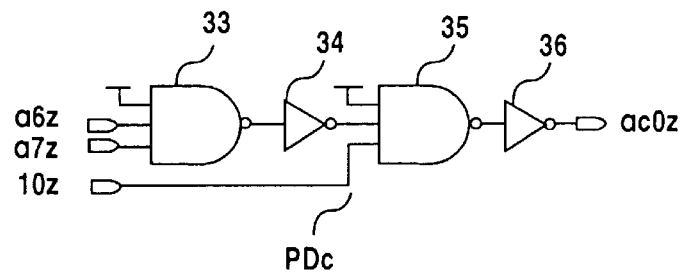
FIGS. 10A and 10B are diagrams exemplifying predecoders.
Figure 10B:
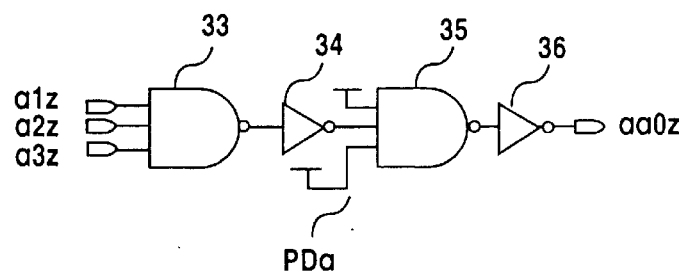

FIGS. 10A and 10B are diagram exemplifying the predecoders. FIG. 10A shows the predecoder PDc which has inputs of an address latch signal 10 and address signals a6 and a7, and FIG. 10B shows the predecoder PDa having inputs of address signals a1, a2 and a3. In FIG. 10A and 10B, all input signals are high active, i.e. a6z, a7z, 10z, a1z, a2z, a3z. The predecoders PDb and PDa are almost identical to each other.

Each of those predecoders comprises a NAND gate 33, an inverter 34, a NAND gate 35 and an inverter 36. In the predecoder PDc shown in FIG. 10A, the address signals a6z and a7z are input to the two input terminals of the NAND gate 33 whose third input terminal is fixed to the supply voltage (H level). The address latch signal 10z is supplied to one input terminal of the NAND gate 35. The other input terminals of the NAND gate 35 are connected to the output of the inverter 34, which is obtained by decoding the address signals a6z and a7z, and the supply voltage (H level). Therefore, a predecode signal ac0z which is the output of this predecoder rises to an H level at the rising of the address latch signal 10z when the address signals a6z and a7z are both at H levels.

The predecoder PDa in FIG. 10B has a structure similar to that of the predecoder PDc with the exception that address signals a1z, a2z and a3z are input to the three input terminals of the NAND gate 33 and the supply voltage (H level) is connected to two input terminals of the NAND gate 35 so that the gate 35 serves as an inverter. The predecoder PDb differs from the predecoder PDa only in that address signals are input to two input terminals of the latter NAND gate 33 while the supply voltage (H level) is connected to the remaining one input terminal.

Figure 11:
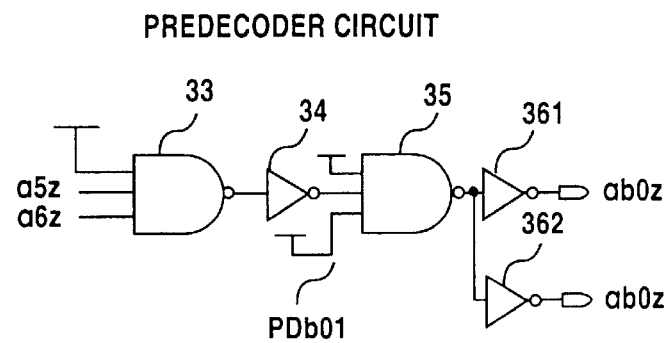
FIG. 11 is a diagram depicting an example of a predecoder PDb00 used in FIGS. 6 and 8.

FIG. 11 is a diagram depicting an example of a predecoder PDb01 which is used in FIGS. 6 and 8. This predecoder has two output terminals both of which output a predecode signal ab0z to drive the predecode lines PLb. This predecoder is identical to the one shown in FIG. 10B with the only difference lying in that two inverters 361 and 362 are provided at the output stage.

Main Decoders

Figure 12A:
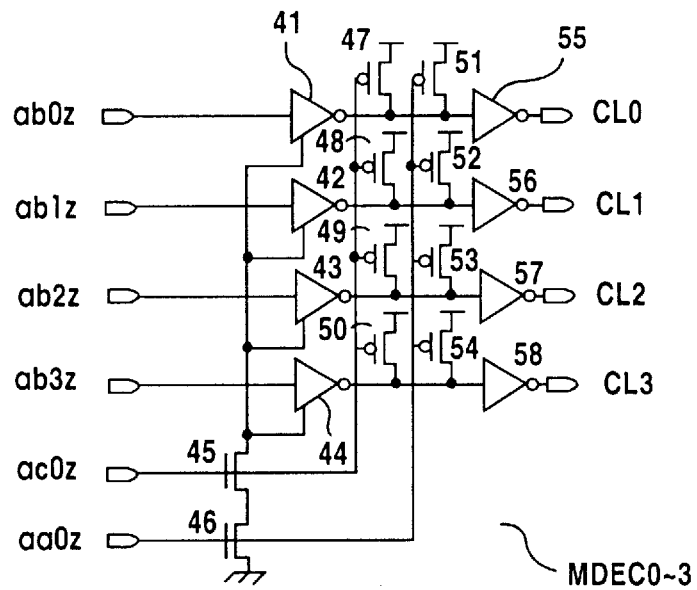
FIGS. 12A and 12B are diagrams exemplifying main decoders MDEC.
Figure 12B:
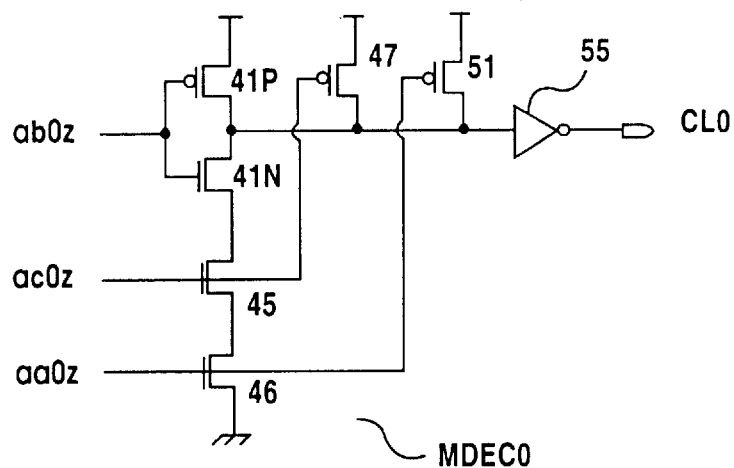

FIG. 12 is a diagram exemplifying main decoders MDEC. In the example in FIG. 12A, the four main decoders MDEC0 to MDEC3 shown in FIG. 3 and other figures are realized by a single circuit. Normally, the memory cell region has bit lines and word lines running in a very narrow area. Thus, the main decoder should have a circuit structure that matches the narrow pitch. In this example, four main decoders are realized by a single circuit. FIG. 12B is a detailed circuit diagram showing only the main decoder MDEC0.

The predecoder in FIG. 12B is a NAND gate having three inputs of predecode signals ab0z, ac0z and aa0z, which is constituted of a CMOS circuit. When all the three inputs become H levels, the output CL0 becomes an H level. In this case, because the timing for the predecode signal ac0z is controlled by the address latch signal 10 as mentioned above, the operational timing for the main decoder is also controlled by the address latch signal 10.

In the example in FIG. 12A, predecode signals ab0z, ab1z, ab2z and ab3z are input. When predecode signals ac0z and aa0z both have H levels, therefore, this circuit is selected and those of the outputs CL0 to CL3 which correspond to those of the four predecode signals ab0z, ab1z, ab2z and ab3z which have H levels become H levels and are selected. Reference numerals "41" to "44" and "55" to "58" are CMOS inverters, and "45" to "54" are transistors.

Although the foregoing description of this embodiment has been given of the decoder circuit which generates a column select signal CL, this invention is not limited to this particular type but may also be adapted to a decoder circuit which generates a word select signal.

According to this invention, in a decoder circuit in which address signals are separated into a plurality of groups, and which comprises a plurality of predecoders and main decoders that receive the outputs of the predecoders, even when the numbers of the separated groups of address signals differ from one another, the load of the lines for the address signals output from the address buffers and the load of the lines for the predecode signals output from the predecoders are made as equal as possible, the transitions of the predecode signals occur at substantially the same timing. For this purpose, the predecoders are provided in double, though it appears as redundant, or each predecoder is designed to have a plurality of outputs in such a way that the numbers of the input terminals of the main decoders to be connected to different groups of predecode lines become equal to one another. As a result, the loads of the predecode lines become substantially equal to one another.

According to this invention, in short, the loads of the address lines are all made equal to one another. So are the loads of the predecode lines. This structure can therefore shorten the overall address transition time.

What is claimed is:

1. A semiconductor memory device having a decoder circuit for decoding a plurality of address signals said address signals including first address signals on first address lines and second address signals on second address lines, comprising:

first predecoders having input terminals connected to said first address lines, for outputting first predecode signals to first predecode lines;

second predecoders having input terminals connected to said second address lines, for outputting second predecode signals to second predecode lines; and main decoders having input terminals connected to said first predecode lines and said second predecode lines, for outputting decode signals, the number of said first address signals being greater than the number of said second address signals, and said second predecoders and said second predecode lines being provided at least in double in such a manner that inputs of said main decoders to be connected to each of said second predecode lines are equal in number to inputs of said main decoders to be connected to each of said first predecode lines.

2. The semiconductor memory device according to claim 1, wherein said main decoders include first main decoders and second main decoders; and half of said doubled second predecode lines are arranged on a side of said first main decoders to be connected to said input terminals thereof, and the other half of second predecode lines are arranged on a side of said second main decoders to be connected to said input terminals thereof.

3. The semiconductor memory device according to claim 1 or 2, wherein the number of said second predecoders is substantially the same as that of said first predecoders.

4. The semiconductor memory device according to claim 1 or 2, wherein the number of said second predecode lines is substantially the same as that of said first predecoder lines.

5. The semiconductor memory device according to claim 1 or 2, wherein said main decoders further receive input signals to be controlled at a timing of an address latch signal, which becomes a first level to render outputs of said main decoders in a non-select state at a time of transition of said external address signals, and becomes a second level to render said outputs of said main decoders in a select state after transition of said predecode signals is completed in accordance with transition of said external address signals.

6. The semiconductor memory device according to claim 1 or 2, wherein the number of said input terminals of said first predecoders to be connected to said first address lines is substantially the same as that of said input terminals of said second predecoders to be connected to said second address lines.

7. A semiconductor memory device having a decoder circuit for decoding a plurality of external address signals supplied, said external address signals including first and second external address signals, comprising:

a first address buffer for receiving said first external address signals and outputting first internal address signals to first address lines;

a second address buffer for receiving said second external address signals and outputting second internal address signals to second address lines;

first predecoders having input terminals connected to said first address lines, for outputting first predecode signals to first predecode lines;

second predecoders having input terminals connected to said second address lines, for outputting second predecode signals to second predecode lines; and main decoders having input terminals connected to said first predecode lines and said second predecode lines, for outputting decode signals, the number of said first external address signals being greater than the number of said second external address signals, and said second predecode lines being provided at least in double in such a manner that inputs of said main decoders to be connected to each of said second predecode lines are equal in number to inputs of said main decoders to be connected to each of said first predecode lines, a plurality of outputs of said second predecoders respectively driving said doubled second predecode lines.

8. The semiconductor memory device according to claim 7, wherein said main decoders including first main decoders and second main decoders; and half of said doubled second predecode lines are arranged on a side of said first main decoders to be connected to said input terminals thereof, and the other half of second predecode lines are arranged on a side of said second main decoders to be connected to said input terminals thereof.

9. The semiconductor memory device according to claim 7 or 8, wherein the number of said second predecode lines is substantially the same as that of said first predecoder lines.

10. The semiconductor memory device according to claim 7 or 8, wherein said main decoders further receive input signals to be controlled at a timing of an address latch signal, which becomes a first level to render outputs of said main decoders in a non-select state at a time of transition of said external address signals and becomes a second level to render said outputs of said main decoders in a select state after transition of said predecode signals is completed in accordance with transition of said external address signals.

11. A semiconductor memory device having a decoder circuit for decoding a plurality of external address signals supplied, said external address signals including first and second external address signals, comprising:

a first address buffer for receiving said first external address signals and outputting first internal address signals to first address lines;

a second address buffer for receiving said second external address signals and outputting second internal address signals to second address lines;

first predecoders having input terminals connected to said first address lines, for outputting first predecode signals to first predecode lines;

second predecoders having input terminals connected to said second address lines, for outputting second predecode signals to second predecode lines; and main decoders having input terminals connected to said first predecode lines and said second predecode lines, for outputting decode signals, the number of said first external address signals being greater than the number of said second external address signals, and said second predecode lines being provided in such a manner that said second predecode lines are substantially equal in number to said first predecode lines.

12. A semiconductor memory device having a decoder circuit for decoding a plurality of external address signals supplied, said external address signals including first and second external address signals, comprising:

a first address buffer for receiving said first external address signals and outputting first internal address signals to first address lines;

a second address buffer for receiving said second external address signals and outputting second internal address signals to second address lines;

first predecoders having input terminals connected to said first address lines, for outputting first predecode signals to first predecode lines;

second predecoders having input terminals connected to said second address lines, for outputting second predecode signals to second predecode lines; and main decoders having input terminals connected to said first predecode lines and said second predecode lines, for outputting decode signals, the number of said first external address signals being greater than the number of said second external address signals, said second predecoders being substantially equal in number to said first predecoders.

13. A semiconductor memory device having a decoder circuit for decoding a plurality of external address signals supplied, said external address signals including first and second external address signals, comprising:

a first address buffer for receiving said first external address signals and outputting first internal address signals to first address lines;

a second address buffer for receiving said second external address signals and outputting second internal address signals to second address lines;

first predecoders having input terminals connected to said first address lines, for outputting first predecode signals to first predecode lines;

second predecoders having input terminals connected to said second address lines, for outputting second predecode signals to second predecode lines; and main decoders having input terminals connected to said first predecode lines and said second predecode lines, for outputting decode signals, the number of said first external address signals being greater than the number of said second external address signals, outputs of said second predecoders being substantially equal in number to outputs of said first predecoders.

* * * * *